(12) United States Patent
Takahashi et al.

(10) Patent No.: US 10,548,217 B1
(45) Date of Patent: Jan. 28, 2020

(54) BASE MATERIAL FOR PRINTED INTERCONNECT BOARDS AND MANUFACTURING METHOD OF PRINTED INTERCONNECT BOARDS

(71) Applicants: SUMITOMO ELECTRIC INDUSTRIES, LTD., Osaka (JP); SUMITOMO ELECTRIC PRINTED CIRCUITS, INC., Shiga (JP)

(72) Inventors: Kenji Takahashi, Osaka (JP); Kouji Nitta, Osaka (JP); Shoichiro Sakai, Osaka (JP); Junichi Motomura, Osaka (JP); Maki Ikebe, Osaka (JP); Kousuke Miura, Shiga (JP); Masahiro Itou, Shiga (JP)

(73) Assignees: SUMITOMO ELECTRIC INDUSTRIES, LTD., Osaka (JP); SUMITOMO ELECTRIC PRINTED CIRCUITS, INC., Shiga (JP)

( * ) Notice: Subject to any disclaimer, the term of this patent is extended or adjusted under 35 U.S.C. 154(b) by 0 days.

(21) Appl. No.: 16/495,234

(22) PCT Filed: Feb. 7, 2018

(86) PCT No.: PCT/JP2018/004120
§ 371 (c)(1),
(2) Date: Sep. 18, 2019

(87) PCT Pub. No.: WO2018/211753
PCT Pub. Date: Nov. 22, 2018

(30) Foreign Application Priority Data

May 16, 2017 (JP) ................. 2017-097657

(51) Int. Cl.
*H05K 1/02* (2006.01)
*H05K 3/18* (2006.01)
(Continued)

(52) U.S. Cl.
CPC ............. *H05K 1/0298* (2013.01); *H05K 1/03* (2013.01); *H05K 1/09* (2013.01); *H05K 3/188* (2013.01)

(58) Field of Classification Search
CPC .......... H05K 1/0298; H05K 1/03; H05K 1/09; H05K 3/188
(Continued)

(56) References Cited

U.S. PATENT DOCUMENTS

| 3,082,327 | A | * | 3/1963 | Rice | ............ | H05K 3/368 |
| | | | | | | 250/208.6 |
| 2013/0183475 | A1 | * | 7/2013 | Yoshida | ............ | H05K 1/0306 |
| | | | | | | 428/43 |
| 2015/0319852 | A1 | * | 11/2015 | Min | ............ | H05K 1/0306 |
| | | | | | | 361/784 |

FOREIGN PATENT DOCUMENTS

JP 2010-93074 4/2010
JP 2012-168342 9/2012

* cited by examiner

*Primary Examiner* — Sherman Ng
(74) *Attorney, Agent, or Firm* — IPUSA, PLLC

(57) ABSTRACT

A base material for printed interconnect boards according to one aspect of the present invention includes a base film; and at least one conductive layer that is layered on the base film. The base material for printed interconnect boards includes a product in which a plurality of interconnect board pieces are regularly arrayed in plan view and includes an outer frame region surrounding the product. The outer frame region includes a proximity region within 5 mm from an outer edge of the product and includes an outside region other than the proximity region. A layered conductive layer area rate of the proximity region is smaller than a layered conductive layer area rate of the product.

10 Claims, 2 Drawing Sheets

(51) Int. Cl.
*H05K 1/09* (2006.01)
*H05K 1/03* (2006.01)

(58) Field of Classification Search
USPC .......................................................... 174/257
See application file for complete search history.

BASE MATERIAL FOR PRINTED INTERCONNECT BOARDS AND MANUFACTURING METHOD OF PRINTED INTERCONNECT BOARDS

TECHNICAL FIELD

The present invention relates to a base material for printed interconnect boards and a manufacturing method of printed interconnect boards.

The present application is based on and claims priority to Japanese Patent Application No. 2017-97657, filed on May 16, 2017, the entire contents of the Japanese Patent Application are hereby incorporated herein by reference.

BACKGROUND ART

Today, electronic devices are used in every field, and these are rapidly reduced in size. In accordance with that, printed interconnect boards used in devices are reduced in size and the interconnect density becomes remarkably dense and complex.

As an efficient method of manufacturing small printed interconnect boards, a method of obtaining a large number of small printed interconnect boards from a single large base material for printed interconnect boards is known. While printed interconnect boards are reduced in size, base materials for printed interconnect boards are increased in size in order to increase production efficiency.

When performing electroplating on a large base material for printed interconnect boards to form a conductive pattern, a variation in a plating film thickness tends to occur. For this reason, even when printed interconnect boards are obtained from one base material for printed interconnect boards, printed interconnect boards having a plating film thickness thinner than a designed value or printed interconnect boards having a plating film thickness thicker than a designed value are tend to be generated. In some cases, there is a possibility that printed interconnect boards that cannot be used as products are generated.

In order to avoid such a situation, a method of forming a plating layer having a uniform thickness by physically making holes in the outer frame region of a base material for printed interconnect boards, by forming a round or square conductive pattern, or by applying a mask is disclosed (Patent Document 1). Although the method enables to form a plating layer having a uniform thickness, it is desired to form a plating layer having a uniform thickness for a more precise circuit pattern and for a large-sized base material for printed interconnect boards with reducing a manufacturing step.

PRIOR ART DOCUMENT

Patent Document

[Patent Document 1] Japanese Laid-open Patent Publication No. 2010-93074

SUMMARY OF THE INVENTION

A base material for printed interconnect boards according to the present invention includes a base film; and at least one conductive layer that is layered on the base film. The base material for printed interconnect boards includes a product in which a plurality of interconnect board pieces are regularly arrayed in plan view and includes an outer frame region surrounding the product. The outer frame region includes a proximity region within 5 mm from an outer edge of the product and includes an outside region other than the proximity region. A layered conductive layer area rate of the proximity region is smaller than a layered conductive layer area rate of the product.

EMBODIMENT FOR CARRYING OUT THE INVENTION

Figure 1:
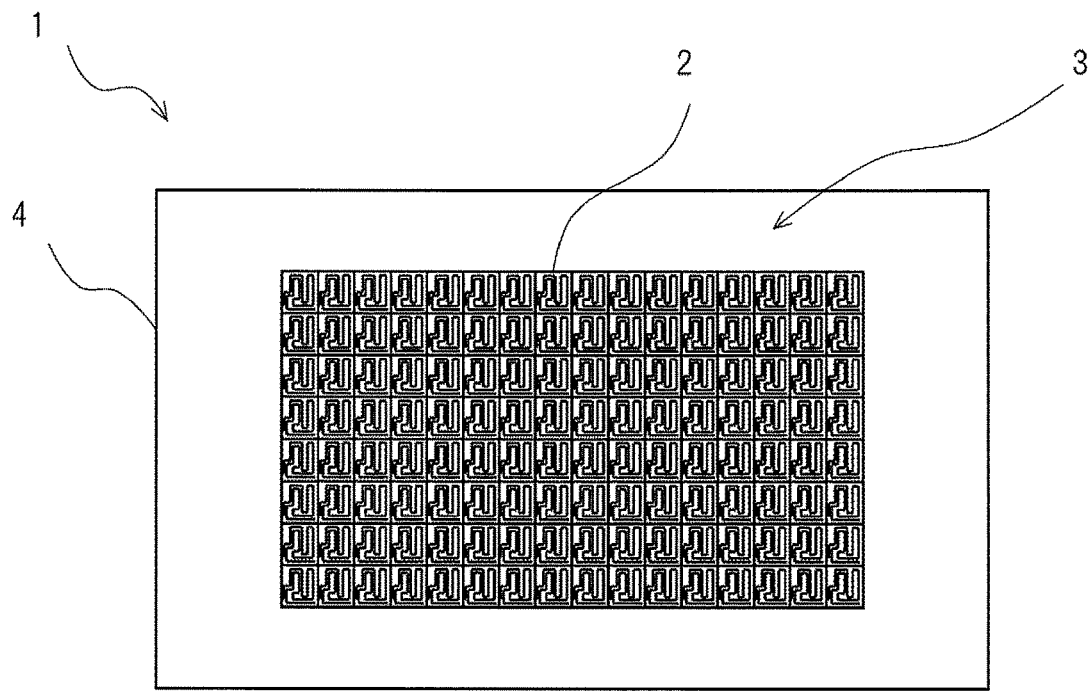
FIG. 1 is a schematic plan view illustrating a base material for printed interconnect boards according to the present invention.
Figure 2:
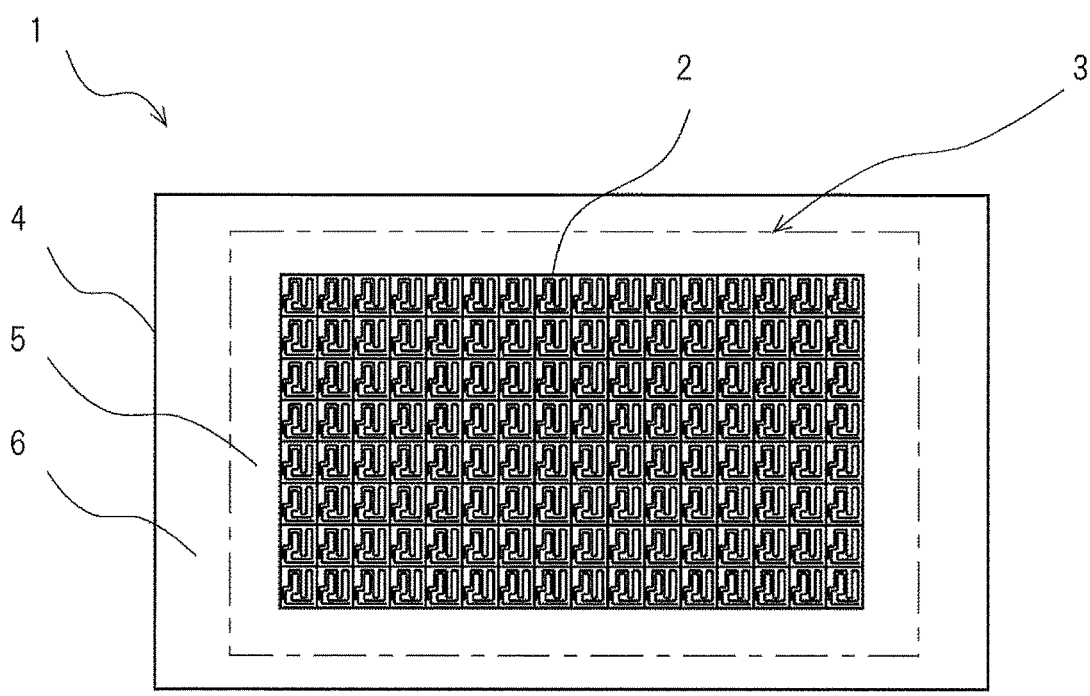
FIG. 2 is a schematic plan view illustrating that an outer frame region of the base material for printed interconnect boards is conceptually separated into a proximity region and an outside region according to the present invention.

[Problem to be Solved by the Present Disclosure]

An object of the present invention is to provide a base material for printed interconnect boards and printed interconnect boards for which a plating film thickness can be made uniform by a simple method without forming a pattern, holes or the like on an outer frame region of the base material for printed interconnect boards.

[Effect of the Present Disclosure]

According to a base material for printed interconnect boards of the present invention, it is possible to reduce a variation in a plating film thickness of individual printed interconnect boards, to enhance productivity, to eliminate an individual difference in product performance, and to stabilize the products.

DESCRIPTION OF EMBODIMENTS OF THE PRESENT INVENTION

First, embodiments of the present invention will be listed.

A base material for printed interconnect boards according to one aspect of the present invention includes a base film; and at least one conductive layer that is layered on the base film. The base material for printed interconnect boards includes a product in which a plurality of interconnect board pieces are regularly arrayed in plan view and includes an outer frame region surrounding the product. The outer frame region includes a proximity region within 5 mm from an outer edge of the product and includes an outside region other than the proximity region. A layered conductive layer area rate of the proximity region is smaller than a layered conductive layer area rate of the product.

In the base material for printed interconnect boards including the product in which the plurality of interconnect board pieces to be printed interconnect boards are arrayed and including the outer frame region surrounding the product, by separating the outer frame region into the proximity region within 5 mm from the outer edge of the product and the outside region other than the proximity region and by making the layered conductive layer area rate of the proximity region smaller than the layered conductive layer area rate of the product, a plating film thickness of the product can be made uniform.

It is preferable that the layered conductive layer area rate of the outside region is larger than the layered conductive layer area rate of the product. That is, by making the layered conductive layer area ratio larger in the order of the proximate region, the product, and the outside region, the plating film thickness can be further made uniform.

It is preferable that the base material for printed interconnect boards includes a plurality of products and outer frame regions and a connection region that connects outer frame regions next to each other, and a layered conductive layer area rate of the connection region is larger than the layered conductive layer area rate of the outside region.

In order to increase production efficiency, in a case in which the base material for printed interconnect boards includes the plurality of products and outer frame regions to have a large sheet shape, a portion that connects the plurality of products and outer frame regions is required. By making the layered conductive layer area rate of the region of the connection portion, that is, by making the layered conductive layer area rate of the connection region larger than the layered conductive layer area rate of the outside region, the plating film thickness of the base material for printed interconnect boards including the plurality of products and outer frame regions can be made uniform.

It is preferable that the connection region is a solid pattern. When the connection region is a solid pattern, the layered conductive layer area rate of the connection region can be made larger than the layered conductive layer area rate of the outside region without controlling the layered conductive layer area rate of the connection region.

It is preferable that the layered conductive layer area rate of the proximity region is 50% or more and 95% or less of the layered conductive layer area rate of the product. By setting the ratio of the layered conductive layer area rate of the proximity region and the layered conductive layer area rate of the product in the above described range, the plating film thickness of the product can be made uniform.

It is preferable that the layered conductive layer area rate of the outside region is 120% or more and 150% or less of the layered conductive layer area rate of the product. By setting the ratio of the layered conductive layer area rate of the outside region and the layered conductive layer area rate of the product in the above described range, the plating film thickness of the product 3 can be made further uniform.

It is preferable that the layered conductive layer area rate of the connection region is 105% or more of the layered conductive layer area rate of the outside region. When the ratio of the layered conductive layer area rate of the connection region and the layered conductive layer area rate of the outside region does not satisfy the above described lower limit, there is a possibility that the plating film thickness of the products cannot be made uniform.

It is preferable that a variation in a plating film thickness in the conductive layer of the product is 15% or less of an average film thickness. When the variation in the plating film thickness in the conductive layer of the product is 15% or less, without generating individual differences in all printed interconnect boards included in the product, stable products can be obtained.

It is preferable that the base material for printed interconnect boards includes a cover layer that covers the product. By providing the cover layer to cover the product, it is possible to prevent the plating film layered on the product from being damaged or the like.

According to one aspect of the present invention, a manufacturing method of printed interconnect boards uses a base material for printed interconnect boards including a base film; and at least one conductive layer that is layered on the base film. The base material for printed interconnect boards includes a product in which a plurality of interconnect board pieces are regularly arrayed in plan view and includes an outer frame region surrounding the product. The outer frame region includes a proximity region within 5 mm from an outer edge of the product and includes an outside region other than the proximity region. A layered conductive layer area rate of the proximity region is smaller than a layered conductive layer area rate of the product. The manufacturing method includes: a plating step of layering a plating film on the conductive layer using electroplating; and a separation step of obtaining printed interconnect boards by taking out the interconnect board pieces from the product.

At the time of layering a plating film on the conductive layer to form a base material for printed interconnect boards, and when the layered conductive layer area rate of the proximity region is smaller than the layered conductive layer area rate of the product, a uniform plating film thickness is formed on the product. The printed interconnect boards that are taken out from this product can exhibit stable performance without individual differences.

DESCRIPTIONS OF EMBODIMENT OF THE PRESENT DISCLOSURE

In the following, base material for printed interconnect boards according to embodiments of the present invention will be described with reference to the drawings as appropriate.

First Embodiment

<Base Material for Printed Interconnect Boards>

A base material 1 for printed interconnect boards according to an aspect of the present invention includes a product 3 in which a plurality of interconnect board pieces 2 are arrayed and includes an outer frame region 4 surrounding the product 3, as illustrated in FIG. 1. The outer frame region 4 does not include interconnect board pieces 2, and is separated and removed from the product 3 when the interconnect board pieces 2 are obtained as printed interconnect boards. The interconnect board pieces 2 and the base material 1 for printed interconnect boards are both formed to be substantially rectangular in a plan view, and several tens to several hundreds of interconnect board pieces 2 are disposed on the base material 1 for printed interconnect boards.

(Product)

The product 3 is composed of the plurality of interconnect board pieces 2 that are regularly arrayed. Small printed interconnect boards manufactured in such a configuration are often small coils or the like, called an array. With respect to the interconnect board pieces 2, a conductive pattern is famed by layering a plating film on a conductive layer on an insulating base film, and by separating and removing a portion other than the product 3 of the base material 1 for printed interconnect boards, each of the interconnect board pieces 2 is obtained from the product 3 as a printed interconnect board.

As a method of forming a conductive pattern, there is typically an additive method and a subtractive method. In a case where the conductive pattern is a fine pattern, an additive method by which it is possible to layer a plating film only on a necessary portion is preferred, and in particular, a semi-active method is currently a mainstream method. Steps of forming a conductive pattern by the semi-active method are outlined as follows. (a) First, a seed layer (conductive layer) is layered on an insulating base film. (b) Next, a photosensitive resist is layered on the seed layer, and patterning corresponding to a conductive pattern is performed by exposure/development or the like to form a resist pattern. (c) In this state, by energization in a plating liquid, a plating film is layered on the exposed seed layer without the resist pattern (hereinafter referred to as the exposed seed layer). (d) Finally, the resist pattern and the seed layer at the portion where the resist pattern has been layered are removed by etching or the like to form a conductive pattern.

(Outer Frame Region)

While surrounding the product 3 in plan view, the outer frame region 4 is present as part of the base material 1 for printed interconnect boards. Because the outer frame region 4 is finally separated and removed from the product 3, it is not necessary to essentially layer a plating film. However, in order to layer a plating film with a uniform thickness on the product 3, it is preferable that the outer frame region 4 is also provided with a conductive layer, and the plating film is layered on the exposed seed layer.

That is, in the electroplating step, at the outer peripheral end portion (outer edge) of the base material 1 for printed interconnect boards, a current distribution in the plating liquid is physically disordered. Due to the disorder of the current distribution, the current distribution toward the product 3 is also disordered. As a result, a variation occurs in the plating film thickness layered on the exposed seed layer (conductive layer) of the product 3. Accordingly, even when printed interconnect boards are obtained from the product 3 in a single base material 1 for printed interconnect boards, boards having a thin plating thickness or boards having a thick plating thickness may be generated, and individual printed interconnect boards may differ in performance. In some cases, there is a possibility that printed interconnect boards whose plating film thickness cannot satisfy a design value and are to be discarded as defective products may be generated. Therefore, in order to control the current distribution at the outer peripheral end portion (outer edge) of the base material 1 for printed interconnect boards in the electrical plating step and to make the current distribution to the product 3 uniform and stable, it is preferable that the conductive layer is also provided on the outer frame region 4 and that the plating film is layered on the exposed seed layer.

The outer frame region 4 of the base material 1 for printed interconnect boards according to the embodiment of the present invention is differentiated by inside and outside of the region. That is, the outer frame region is differentiated into two regions: an inside constant region that is specifically a proximity region 5 within 5 mm from the outer edge of the product; and the remaining outside region as an outside region 6.

As described above, printed interconnect boards are not obtained from the outer frame region 4. Therefore, the plating film layered on the outer frame region 4 is not required to be patterned as a circuit or the like, and it is sufficient that the plating film is layered in some form. By making the area rate of the layered plating film of the proximity region 5, that is, by making the layered conductive layer area rate of the proximity region 5 smaller than the layered conductive layer area rate of product 3, the current distribution toward the product 3 can be made stable and uniform, and the plating film thickness for the product 3 can be made uniform. Note that "layered conductive layer area rate" refers to, for which a predetermined region is set on a surface where a plating film is layered on a base material for printed interconnect boards, a rate of an area of the layered plating film present on the predetermined region.

On the outer frame region 4 according to embodiment of the present invention, it is not required to perform processing to make holes or the like and it is not required to apply a mask at the time of electroplating. Also, the exposed seed layer of the outer frame region 4 is not required to be pattern-designed as a dummy pattern and is not required to be shaped as a circle, a rectangle, a mesh shape, or the like. By only controlling the layered conductive layer area rate of the proximity region 5 with respect to the layered conductive layer area rate of the product 4, the plating film thickness of the product 3 can be easily made uniform.

On the other hand, when the layered conductive layer area rate of the proximity region 5 is smaller than the layered conductive layer area rate of the product 3, the exposed seed layer of the proximate region 5 can be patterned into a circuit. For example, the proximity region 5 may be made into a coupon region for obtaining a test substrate (test coupon) for measuring the characteristic impedance of printed interconnect boards.

Although the layered conductive layer area rate of the proximity region 5 is not particularly limited as long as it is smaller than the layered conductive layer area rate of the product 3, the layered conductive layer area rate of the proximity region 5 is preferably 50% or more and 95% or less with respect to the layered conductive layer area rate of the product 3. By setting the ratio of the layered conductive layer area rate of the proximity region 5 and the layered conductive layer area rate of the product 3 in the above described range, the current distribution toward the product 3 can be made stable and uniform and the plating film thickness of the product 3 can be made uniform.

Within the outer frame region 4, the remaining region obtained by excluding the proximity region 5 is the outside region 6. It is preferable to provide, on the outside region 6, a conductive layer in order to make the thickness of the plating film of the product 3 uniform, and to layer the plating film on the exposed seed layer. By making the layered conductive layer area rate of the outside region 6 larger than the layered conductive layer area rate of the product 3, the plating film thickness of the product 3 can be made further uniform.

That is, relative to the layered conductive layer area rate of the product 3, by decreasing the layered conductive layer area rate of the surrounding portion of the product 3 (the proximity region 5) and by increasing the layered conductive layer area rate of its surrounding portion (the outside region 6), the current distribution toward the product 3 can be made further stable and uniform and the plating film thickness can be made further uniform.

Although the layered conductive layer area rate of the outside region 6 is not limited particularly as long as it is larger than the layered conductive layer area rate of the product 3, the layered conductive layer area rate of the outside region 6 is preferably 120% or more and 150% or less with respect to the layered conductive layer area rate of the product 3. By setting the ratio of the layered conductive layer area rate of the outside region 6 and the layered conductive layer area rate of the product 3 in the above described range, the current distribution toward the product 3 can be made further stable and uniform and the plating film thickness of the product 3 can be made further uniform.

On the outer frame region 4, a marking for positioning or a product code by letters/numbers may be displayed. Such marks and letters/numbers are often represented by a plating film. The outside region 6 may be such a region for printing.

It is preferable that the variation in the plating film thickness in the product 3 is 15% or less of the average film thickness. When the variation in the thickness of the plating film as the conductive layer of the product 3 is 15% or less, there is no performance difference in all printed interconnect boards taken out of the product 3 and no defective products are generated. As described above, by controlling and manufacturing the layered conductive layer area rate of each region, the variation in the plating film thickness of the product 3 can be easily made 15% or less. Note that "the variation in the plating film thickness is 15% or less of the average film thickness" means that the maximum value and the minimum value of the plating film thickness in the product 3 are 15% or less from the average value of the plating film thickness in the product 3.

It is preferable that the base material 1 for printed interconnect boards includes a cover layer that covers the product 3. The printed interconnect boards are obtained through a separation step of separating and removing the outer frame region 4 from the base material 1 for printed interconnect boards and individually cutting the interconnect board pieces 2 of the product 3. The separation step may be performed at a place where the base material 1 for printed interconnect boards is manufactured or may be performed at a place where devices on which printed interconnect boards obtained from the base material 1 for printed interconnect boards are mounted are manufactured. In a case in which the separation step is performed at the place where such devices are manufactured, the conductive pattern formed on the product 3 may be damaged during storage, transportation, or the like of the base material 1 for printed interconnect boards. By the base material 1 for printed interconnect boards having a cover layer to cover the product 3, it is possible to prevent the conductive pattern of the product 3 from being damaged during storage, transportation, or the like of the base material 1 for printed interconnect boards.

Second Embodiment

Figure 3:
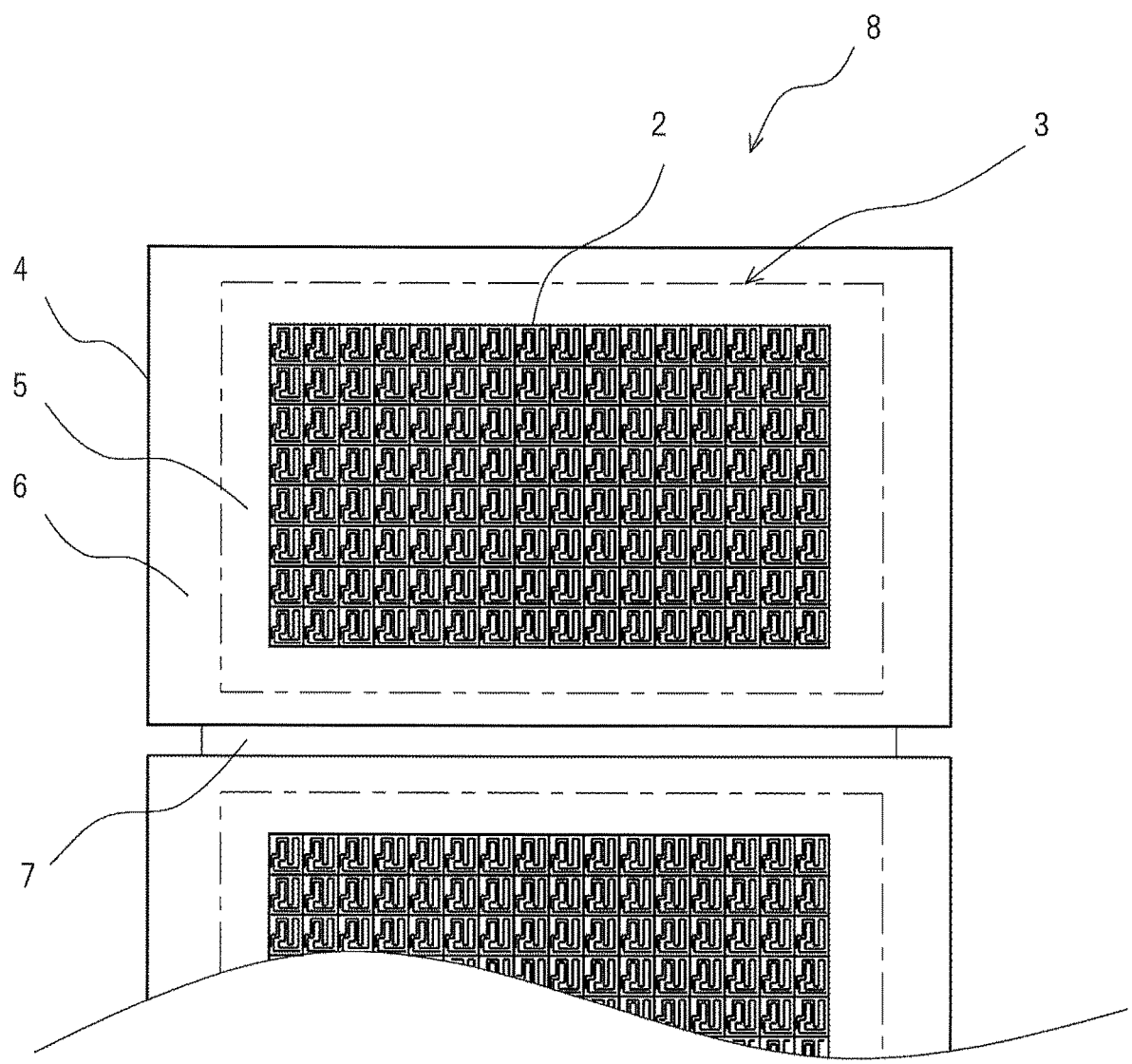
FIG. 3 is a schematic plan view illustrating a large sheet-shaped base material for printed interconnect boards (base material sheet) for which a plurality of base materials for printed interconnect boards are in continuous according to the present invention.

Next, a base material 8 for printed interconnect boards according to one aspect of the present invention will be described. As illustrated in FIG. 3, the base material 8 for printed interconnect boards has a large sheet shape having a plurality of products 3 and outer frame regions 4 (hereinafter, the base material 8 for printed interconnect boards may be referred to as the base material sheet 8). The base material sheet 8 includes connection regions 7 that connect the outer frame regions 4 next to each other. Because the base material 8 is formed to be substantially rectangular in a plan view, and several tens to several hundreds of interconnect board pieces 2 are disposed in one product 3, several hundreds of printed interconnect boards are manufactured at once from the base material sheet 8.

(Connection Region)

A connection region 7 connects an outer frame region 4 and another outer frame region that is in communication with this outer frame region 4. That is, the connection regions 7 for connecting a plurality of products and outer frame regions to form a large base material 8 (base material sheet 8) for printed interconnect board are present independently of the outer frame regions 4. The connection regions 7 are separated and removed when the interconnect board pieces 2 are obtained from the products 3 as printed interconnect boards.

As with the outer frame regions 4, the connection regions 7 are finally separated and removed, and thus it is not essentially necessary to layer a plating film. However, it is preferable to provide a conductive layer on the connection regions 7 and to layer a plating film on the exposed seed layer in order to make the plating film thickness of all the products 3 uniform included in a large-sized based material sheet 8 including the plurality of products 3 and outer frame regions 4. By making the layered conductive layer area rate of the connection regions 7 larger than the layered conductive layer area rate of the outside regions 6, every current distribution toward the plurality of products 3 can be stabilized, and the plating film thickness of all the products 3 can be made uniform.

The connection regions 7 are preferably a solid pattern. When an exposed seed layer is present on almost the entire surface of the connection regions 7, the layered conductive layer area rate of the outside regions 6 can be easily increased without controlling the layered conductive layer area rate of the connection regions 7. Note that the "solid pattern" means that, for which a predetermined regions is set, a plating film is layered on almost the entire surface of the predetermined region.

Although the layered conductive layer area rate of the connection regions 7 is not limited particularly as long as it is larger than the layered conductive layer area rate of the outside regions 6, the layered conductive layer area rate of the connection regions 7 is preferably 105% or more with respect to the layered conductive layer area rate of the outside regions 6. When the ratio of the layered conductive layer area rate of the connection regions 7 and the layered conductive layer area rate of the outside regions does not satisfy the above described lower limit, there is a possibility that the plating film thickness of the plurality of products 3 cannot be made uniform.

Other Embodiments

The embodiments disclosed above should be considered exemplary in all respects and not limiting. The scope of the present invention is not limited to configurations of the above described embodiments, but is indicated by claims and is intended to include all changes within the meaning and scope of equivalence with the claims.

Although the outer frame region is separated into the proximity region and the outside region to control the layered conductive layer area rates in the above described embodiments, the present invention is not limited to this. The scope of the present invention includes to further subdivide the outer frame region into three or more regions and to precisely control the layered conductive layer area rates in order to make the plating film thickness uniform.

Although the connection region is a region independent of the outer frame region in the above-described embodiment, in a case in which a base material sheet is composed by directly connecting the outer frame region of a base material for printed interconnect boards and the outer frame region of another base material for printed interconnect boards, a part of the outside regions can be a connecting region.

DESCRIPTION OF THE REFERENCE NUMERALS 1 base material for printed interconnect boards
2 interconnect board piece
3 product
4 outer frame region
5 proximity region
6 outside region
7 connection region 8 base material for printed interconnect boards (base material sheet)

The invention claimed is:

1. A base material for printed interconnect boards comprising:
   a base film; and
   at least one conductive layer that is layered on the base film,
   wherein the base material for printed interconnect boards includes a product in which a plurality of interconnect board pieces are regularly arrayed in plan view and includes an outer frame region surrounding the product,
   wherein the outer frame region includes a proximity region within 5 mm from an outer edge of the product and includes an outside region other than the proximity region, and
   wherein a layered conductive layer area rate of the proximity region is smaller than a layered conductive layer area rate of the product.

2. The base material for printed interconnect boards according to claim 1, wherein a layered conductive layer area rate of the outside region is larger than the layered conductive layer area rate of the product.

3. The base material for printed interconnect boards according to claim 2, further comprising:
   a plurality of products and outer frame regions and
   a connection region that connects outer frame regions next to each other,
   wherein a layered conductive layer area rate of the connection region is larger than the layered conductive layer area rate of the outside region.

4. The base material for printed interconnect boards according to claim 3, wherein the connection region is a solid pattern.

5. The base material for printed interconnect boards according to claim 1, wherein the layered conductive layer area rate of the proximity region is 50% or more and 95% or less of the layered conductive layer area rate of the product.

6. The base material for printed interconnect boards according to claim 2, wherein the layered conductive layer area rate of the outside region is 120% or more and 150% or less of the layered conductive layer area rate of the product.

7. The base material for printed interconnect boards according to claim 3, wherein the layered conductive layer area rate of the connection region is 105% or more of the layered conductive layer area rate of the outside region.

8. The base material for printed interconnect boards according to claim 1, wherein a variation in a plating film thickness in the conductive layer of the product is 15% or less of an average film thickness.

9. The base material for printed interconnect boards according to claim 1, further comprising: a cover layer that covers the product.

10. A manufacturing method of printed interconnect boards by using a base material for printed interconnect boards including a base film; and at least one conductive layer that is layered on the base film,
    wherein the base material for printed interconnect boards includes a product in which a plurality of interconnect board pieces are regularly arrayed in plan view and includes an outer frame region surrounding the product,
    wherein the outer frame region includes a proximity region within 5 mm from an outer edge of the product and includes an outside region other than the proximity region,
    wherein a layered conductive layer area rate of the proximity region is smaller than a layered conductive layer area rate of the product, and
    wherein the manufacturing method includes:
    a plating step of layering a plating film on the conductive layer using electroplating; and
    a separation step of obtaining printed interconnect boards by taking out the interconnect board pieces from the product.

* * * * *